US009685697B2

(12) United States Patent

Chen et al.

(10) Patent No.: US 9,685,697 B2

(45) Date of Patent: Jun. 20, 2017

(54) TUNABLE ANTENNA STRUCTURE AND WIRELESS COMMUNICATION DEVICE EMPLOYING SAME

(71) Applicant: Chiun Mai Communication Systems, Inc., New Taipei (TW)

(72) Inventors: Jin-Bo Chen, New Taipei (TW); Cho-Kang Hsu, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 213 days.

(21) Appl. No.: 14/463,888

(22) Filed: Aug. 20, 2014

(65) Prior Publication Data

US 2015/0054697 A1 Feb. 26, 2015

(30) Foreign Application Priority Data

Aug. 22, 2013 (CN) .......................... 2013 1 0367231

(51) Int. Cl.

*H01Q 1/48* (2006.01)
*H01Q 1/50* (2006.01)
*H03H 7/38* (2006.01)
*H01F 21/12* (2006.01)

(52) U.S. Cl.

CPC ............... *H01Q 1/50* (2013.01); *H01F 21/12* (2013.01); *H03H 7/38* (2013.01)

(58) Field of Classification Search

CPC .......... H01Q 9/42; H01Q 1/24; H01Q 13/203; H01Q 21/20

USPC ........................................ 343/845, 745, 739

See application file for complete search history.

(56) References Cited

U.S. PATENT DOCUMENTS

2009/0278755 A1* 11/2009 Shoji ........................ H01Q 1/24 343/745
2013/0229316 A1* 9/2013 Chen ...................... H01Q 23/00 343/729
2014/0375515 A1* 12/2014 Qiu ........................ H01Q 1/243 343/745

* cited by examiner

*Primary Examiner* — Graham Smith
*Assistant Examiner* — Collin Dawkins
(74) *Attorney, Agent, or Firm* — Steven Reiss

(57) ABSTRACT

A tunable antenna structure includes an antenna, a first switch circuit and a second switch circuit. The antenna structure includes a feeding point configured to feed current signal and a grounding point configured to be grounded. The first switch circuit includes a first plurality of loads and a first switch electronically coupled to the feeding point and the first plurality of loads. The first switch is configured to selectively couple one of the first plurality of loads to the feeding point. The second switch circuit includes a second plurality of loads and a second switch electronically coupled to the grounding point and the second plurality of loads. The second switch is configured to selectively couple one of the second plurality of loads to the grounding point.

8 Claims, 2 Drawing Sheets

100
10
13
11
50
40
C1
L6
Signal source
31
21
C2
L5
R
L1
L2
L3
L4
20
30

TUNABLE ANTENNA STRUCTURE AND WIRELESS COMMUNICATION DEVICE EMPLOYING SAME

FIELD

The subject matter herein generally relates to antenna structures, and particular to a tunable antenna structure and wireless communication device employing same.

BACKGROUND

With improvements in the integration of wireless communication systems, antennas have become increasingly important. For a wireless communication device to utilize various frequency bandwidths, multiband antennas have become a significant technology.

BRIEF DESCRIPTION OF THE DRAWINGS

Implementations of the present technology will now be described, by way of example only, with reference to the attached figures.

DETAILED DESCRIPTION

Figure 1:
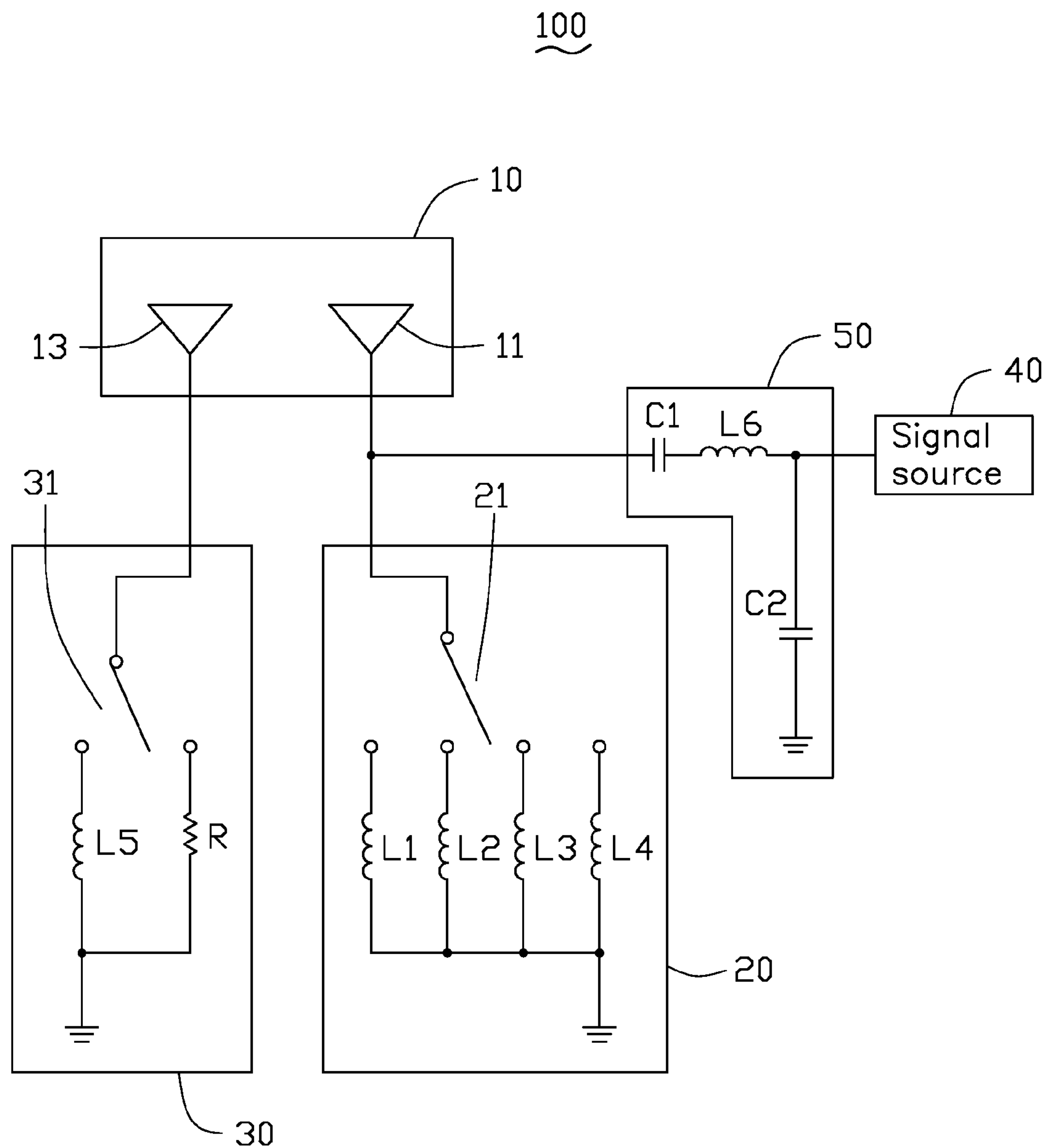
FIG. 1 is a circuit diagram of one embodiment of a tunable antenna structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series and the like.

FIG. 1 illustrates a circuit diagram of one embodiment of a tunable antenna structure 100. The tunable antenna structure 100 can be used in a wireless communication device, such as a mobile phone or a tablet computer. The tunable antenna structure 100 includes an antenna component 10, a first switch circuit 20, and a second switch circuit 30. The antenna component 10 includes a feeding point 11 and a grounding point 13. The feeding point 11 can feed current signal; the grounding point 13 can be grounded.

The first switch circuit 20 includes a first plurality of loads and a first switch 21 electronically coupled to the feeding point 11 and the first plurality of loads. The first switch 22 is configured to selectively couple one of the first plurality of loads to the feeding point 11. In one embodiment, as illustrated in FIG. 1, the first plurality of loads includes four inductors L1-L4. In other words, the first switch 22 can selectively couple one of the four inductors L1-L4 to the feeding point 11. One terminal of each of the inductors L1-L4 is grounded, another terminal of each of the inductors L1-L4 is electronically coupled to the first switch 21.

The second switch circuit 30 includes a second plurality of loads and a second switch 31 electronically coupled to the grounding point 13 and the second plurality of loads. The second switch 31 is configured to selectively couple one of the second plurality of loads to the grounding point 13. In one embodiment, as illustrated in FIG. 1, the second plurality of loads includes an inductor L5 and a zero ohm resistor R. The second switch 31 can selectively couple either the inductor L5 or the zero ohm resistor R to the grounding point 13. One terminal of each of the inductor L5 and the zero ohm resistor R is grounded, another terminal of each of the inductor L5 and the zero ohm resistor R is electronically coupled to the second switch 31.

In one embodiment, a value of the inductor L1 is in a range of from about 8.2 nH to about 9.1 nH; a value of the inductor L2 is in a range of from about 4.7 nH to about 5.6 nH; a value of the inductor L3 is in a range of from about 3.9 nH to about 4.7 nH; a value of the inductor L4 is in a range of from about 1.2 nH to about 2 nH; a value of the inductor L5 is in a range of from about 68 nH to about 120 nH.

The tunable antenna structure 100 further includes a signal source 40 and an impedance matching circuit 50. The signals source 40 is electronically coupled to the feeding point 11. In one embodiment, the signal source 40 is electronically coupled to the feeding point 11 via the impedance matching circuit 50. In particular, the impedance matching circuit 50 includes two capacitors C1-C2 and an inductor L6. The inductor L6 and the first capacitor C1 are electronically coupled in series between the signal source 40 and a node between the feeding point 11 and the first switch 21. One terminal of the second capacitor C2 is electronically coupled to a node between the signal source 40 and the inductor L6, another terminal of the second capacitor C2 is grounded.

In one embodiment, a value of the inductor L6 is in a range of from about 3.9 nH to about 5.1 nH; a value of the capacitor C1 is in a range of from about 1.2 pF to about 2.2 pF; a value of the capacitor C2 is in a range of from about 1.2 pF to about 2.2 pF.

Figure 2:
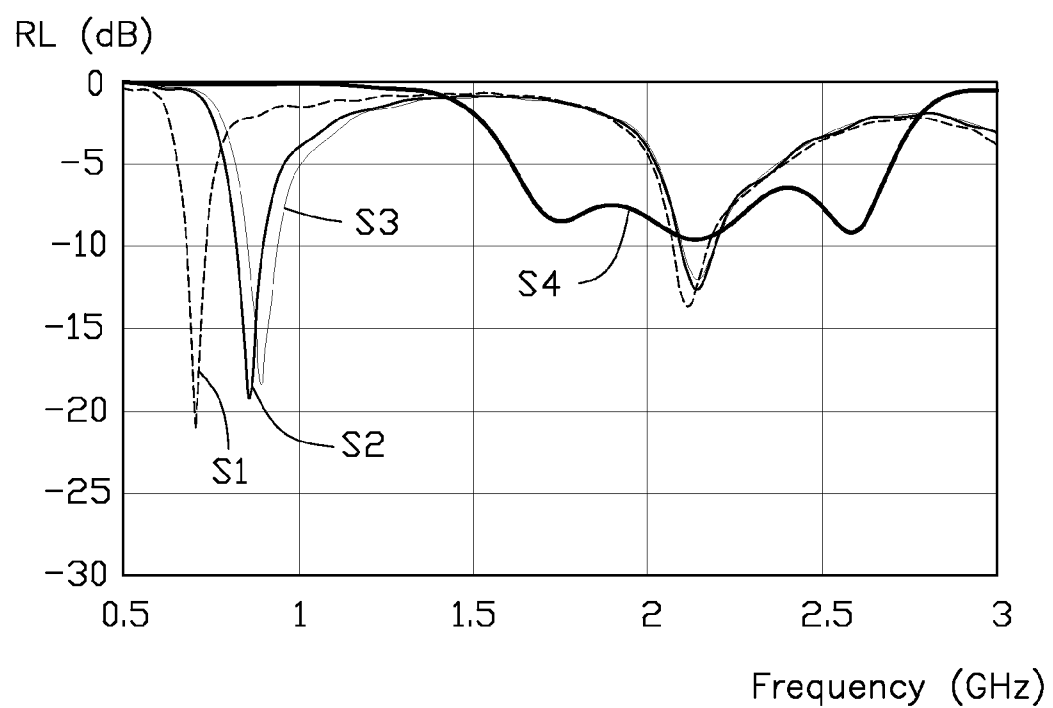
FIG. 2 is a diagram showing return loss ("RL") measurements of the tunable antenna structure shown in FIG. 1.

FIG. 2 illustrates a diagram showing return loss ("RL") measurements of the tunable antenna structure 100 of FIG. 1. The tunable antenna structure 100 can work at different working mode to receive/send wireless signals at different frequency band by the switch of the first and second switches 21 and 31. Curves S1-S4 respectively represent RL of the tunable antenna structure 100 when the tunable antenna structures 100 works at different working mode. In particular, in use, when the first switch 21 couples the inductor L1 to the feeding point 11 and the second switch 31 couples the inductor L5 to the grounding point 13, the tunable antenna structure 100 can receive/send wireless signals at a first frequency band from about 704 MHz to about 746 MHz as illustrated by curve S1. When the first switch 21 couples the inductor L2 to the feeding point 11 and the second switch 31 couples the inductor L5 to the grounding point 13, the tunable antenna structure 100 can receive/send wireless signals at a second frequency band from about 824 MHz to about 875 MHz as illustrated by curve S2. When the first switch 21 couples the inductor L3 to the feeding point 11 and second switch 31 couples the inductor L5 to the grounding point 13, the tunable antenna structure 100 can receive/send wireless signals at a third frequency band from about 875 MHz to about 960 MHz as illustrated by curve S3. When the first switch 21 couples the inductor L4 to the feeding point 11 and the second switch 31 couples the zero ohm resistor R to the grounding point 13, the tunable antenna structure 100 can receive/send wireless signals at a fourth frequency band from about 1710 MHz to about 2690 MHz as illustrated by curve S4. Accordingly, the tunable antenna structure 100 can be used in common wireless communication systems, such as LTE700/GSM850/EGSM900/DCS1800/PCS1900/UMTS2100/LTE2300/LTE2500.

Table 1 illustrates gains of the tunable antenna structure 100 when the antenna structure 100 is used in different wireless communication systems. It can be derived from the table 1 that the tunable antenna structure 100 can used in different communication systems with acceptable gains.

TABLE 1

| Frequency band | Gains of signals received by the tunable antenna structure | Gains of signals sent by the tunable antenna structure |
|---|---|---|
| LTE700 | −6.10 | −6.15 |
| GSM850 | −4.94 | −3.55 |
| EGSM900 | −3.30 | −2.95 |
| DCS1800 | −2.67 | −3.37 |
| PCS1900 | −3.46 | −3.10 |
| UMTS2100 | −3.17 | −1.45 |
| LTE2300 | −1.61 | −2.45 |
| LTE2500 | −3.10 | −4.86 |

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A tunable antenna structure comprising:

an antenna component comprising a feeding point configured to feed current signal and a grounding point configured to be grounded;

a first switch circuit comprising a first plurality of loads and a first switch electronically coupled to the feeding point and the first plurality of loads; the first switch configured to selectively couple one of the first plurality of loads to the feeding point;

a second switch circuit comprising a second plurality of loads and a second switch electronically coupled to the grounding point and the second plurality of loads; the second switch configured to selectively couple one of the second plurality of loads to the grounding point;

wherein one terminal of each of the first groups of loads is grounded, another terminal of each of the first plurality of loads is electronically coupled to the first switch;

wherein one terminal of each of the second groups of loads is grounded, another terminal of each of the second plurality of loads is electronically coupled to the second switch;

wherein the first plurality of loads comprises a first inductor, a second inductor, a third inductor, and a fourth inductor; the second plurality of loads comprises a fifth inductor and a zero ohm resistor; when the first switch couples the first inductor with the feeding point and the second switch couples the fifth inductor with the grounding point, the tunable antenna structure is configured to receive/send wireless signals at a first frequency band; wherein when the first switch couples the second inductor with the feeding point and the second switch couples the fifth inductor with the grounding point, the tunable antenna structure is configured to receive/send wireless signals at a second frequency band; wherein when the first switch couples the third inductor with the feeding point and the second switch couples the fifth inductor with the grounding point, the tunable antenna structure is configured to receive/send wireless signals at a third frequency band; and wherein when the first switch couples the fourth inductor with the feeding point and the second switch couples the zero ohm resistor with the grounding point, the tunable antenna structure is configured to receive/send wireless signals at a fourth frequency band.

2. The tunable antenna structure of claim 1, wherein a value of the first inductor is from 8.2 nH to 9.1 nH; a value of the second inductor is from 4.7 nH to 5.6 nH; a value of the third inductor is from 3.9 nH to 4.7 nH; a value of the fourth inductor is from 1.2 nH to 2 nH; a value of the fifth inductor is from 68 nH to 120 nH.

3. The tunable antenna structure of claim 1, further comprising an impedance matching circuit and a signal source, wherein the impedance matching circuit comprises a first capacitor, a second capacitor and an inductor, the inductor and the first capacitor are electronically coupled in series between the signal source and a node between the feeding point and the first switch; one terminal of the second capacitor is electronically coupled to a node between the signal source and the inductor, another terminal of the second capacitor is grounded.

4. The tunable antenna structure of claim 3, wherein a value of the inductor is from 3.9 nH to 5.1 nH; a value of the first capacitor is from 1.2 pF to 2.2 pF; a value of the second capacitor is from 1.2 pF to 2.2 pF.

5. A wireless communication device comprising:

a signal source;

a tunable antenna structure comprising:

an antenna component comprising a feeding point electronically coupled to the single source;

a first switch circuit comprising a first plurality of loads and a first switch electronically coupled to the feeding point and the first plurality of loads; the first switch configured to selectively couple one of the first plurality of loads to the feeding point;

a second switch circuit comprising a second plurality of loads and a second switch electronically coupled to the grounding point and the second plurality of loads;

wherein one terminal of each of the first groups of loads is grounded, another terminal of each of the first plurality of loads is electronically coupled to the first switch;

wherein one terminal of each of the second groups of loads is grounded, another terminal of each of the second plurality of loads is electronically coupled to the second switch;

wherein the second switch is configured to selectively couple one of the second plurality of loads to the grounding point; the first plurality of loads comprises a first inductor, a second inductor, a third inductor, and a fourth inductor; the second plurality of loads comprises a fifth inductor and a zero ohm resistor; wherein when the first switch couples the first inductor with the feeding point and the second switch couples the fifth inductor with the grounding point, the tunable antenna structure is configured to receive/send wireless signals at a first frequency band; wherein when the first switch couples the second inductor with the feeding point and the second switch couples the fifth inductor with the grounding point, the tunable antenna structure is configured to receive/send wireless signals at a second frequency band; wherein when the first switch couples the third inductor with the feeding point and the second switch couples the fifth inductor with the grounding point, the tunable antenna structure is configured to receive/send wireless signals at a third frequency band; and wherein when the first switch couples the fourth inductor with the feeding point and the second switch couples the zero ohm resistor with the grounding point, the tunable antenna structure is configured to receive/send wireless signals at a fourth frequency band.

6. The wireless communication device of claim 5, wherein a value of the first inductor is from 8.2 nH to 9.1 nH; a value of the second inductor is from 4.7 nH to 5.6 nH; a value of the third inductor is from 3.9 nH to 4.7 nH; a value of the fourth inductor is from 1.2 nH to 2 nH; a value of the fifth inductor is from 68 nH to 120 nH.

7. The wireless communication device of claim 5, further comprising an impedance matching circuit, wherein the impedance matching circuit comprises a first capacitor, a second capacitor and an inductor, the inductor and the first capacitor are electronically coupled in series between the signal source and a node between the feeding point and the first switch; one terminal of the second capacitor is electronically coupled to a node between the signal source and the inductor, another terminal of the second capacitor is grounded.

8. The wireless communication device of claim 7, wherein a value of the inductor is from 3.9 nH to 5.1 nH; a value of the first capacitor is from 1.2 pF to 2.2 pF; a value of the second capacitor is from 1.2 pF to 2.2 pF.

* * * * *